United States Patent [19]
Hasegawa

[11] Patent Number: 5,399,886
[45] Date of Patent: Mar. 21, 1995

[54] HETEROJUNCTION FET WITH A HIGH POTENTIAL BARRIER LAYER AND GATE STRUCTURE

[75] Inventor: Yuuichi Hasegawa, Kawasaki, Japan

[73] Assignee: Fujitsu Limited, Kawasaki, Japan

[21] Appl. No.: 186,466

[22] Filed: Jan. 26, 1994

[30] Foreign Application Priority Data

Jan. 27, 1993 [JP] Japan ................................ 5-011282

[51] Int. Cl.⁶ .................. H01L 29/784; H01L 29/804; H01L 29/812
[52] U.S. Cl. .................................. 257/192; 257/194; 257/472
[58] Field of Search ............... 257/192, 194, 488, 489, 257/472, 473, 476, 491

[56] References Cited

FOREIGN PATENT DOCUMENTS

| 0469768 | 2/1992 | European Pat. Off. | ............ 257/194 |
| 58-0140168 | 8/1983 | Japan | ................... 257/192 |
| 62-0274674 | 11/1987 | Japan | ................... 257/194 |
| 3-11745 | 1/1991 | Japan | ................... 257/192 |

OTHER PUBLICATIONS

Li et al; "Molecular Beam Epitaxial GaAs/Al₀.₂Ga₀.₈As p-Channel FET on (311)A Facets of Patterned (100) GaAs Obtained by Silicon Doping"; vol. 12, No. 7, IEEE Electron Devices Letters.

Ho et al; "Extremely high gain, low noise InAlAs/InGaAs HEMTS Grown by MBE"; IEDM; 1988 pp. 184–186.

Primary Examiner—Rolf Hille
Assistant Examiner—Wael M. Fahmy
Attorney, Agent, or Firm—Staas & Halsey

[57] ABSTRACT

A field effect semiconductor device which restricts current flow through a drain-gate path, but allows current to easily flow through a gate-source path. A high potential barrier layer is formed on the drain side of an active layer. The potential barrier layer has a wider energy band gap than the active layer. A source electrode and a drain electrode make ohmic contact with the active layer and a gate electrode exists between the source electrode and the drain electrode. The gate electrode is partially formed on the potential barrier layer and makes Schottky contact with the active layer on the source side of the semiconductor device and makes Schottky contact with the potential barrier layer on the drain side of the semiconductor device.

20 Claims, 10 Drawing Sheets

PRIOR ART : IMPROVED

HETEROJUNCTION FET WITH A HIGH POTENTIAL BARRIER LAYER AND GATE STRUCTURE

BACKGROUND OF THE INVENTION a) Field of the Invention

The present invention relates to a field effect semiconductor device, and more particularly to a field effect compound semiconductor device suitable for operating at a large signal amplitude and at a high frequency.

b) Description of the Related Art

Compound semiconductors generally have a higher carrier mobility than silicon. Field effect semiconductor devices having a compound semiconductor channel layer are known as semiconductor devices capable of operating at a high frequency. For example, these field effect semiconductor devices are widely used in the fields of supercomputers, microwave communications, and the like. In particular, semiconductor devices used for mobile station microwave communications are required to have a small power consumption and high efficiency.

A metal-semiconductor field effect transistor (MESFET) uses compound semiconductor and has a Schottky electrode. Use of compound semiconductor enables MESFET to operate at a high speed.

A current flowing between the drain and source of a MESFET is controlled by applying a backward bias voltage to the Schottky gate electrode so as to develop a depletion layer. In a large signal operation, a signal having a large amplitude is applied to the gate electrode so that the voltage at the gate electrode changes greatly. When a large backward bias voltage is instantaneously applied to the gate electrode, the drain-source current reduces and the drain voltage rises. As a result, a high voltage is applied between the gate electrode and drain electrode. When the drain-gate voltage exceeds the breakdown voltage of the Schottky gate electrode, a backward gate current flows.

When a forward bias voltage is instantaneously applied to the gate electrode, a forward gate current flows from the gate electrode to the source electrode. This forward gate current substantially deepens the gate bias, thus reducing the drain current.

It is preferable that a Schottky gate electrode has a high backward breakdown voltage and that a forward gate current is easily injected during the forward bias operation.

In order to realize a MESFET with a Schottky gate electrode having a high backward breakdown voltage, it has been proposed to form a potential barrier layer with a wide band gap between the channel layer and Schottky electrode. Although this potential barrier layer improves tile backward breakdown voltage of the Schottky gate electrode, the current injection ability during the forward bias operation is lowered.

SUMMARY OF THE INVENTION

It is an object of the present invention to provide a high quality field effect compound semiconductor device.

It is another object of the present invention to provide a field effect compound semiconductor device having a Schottky gate electrode with a high breakdown voltage and an excellent forward current injection ability.

According to one aspect of the present invention, there is provided a field effect semiconductor device comprising; a compound semiconductor active layer, a pair of current electrode structures formed on and making ohmic contacts with said active layer, a gate electrode disposed between said pair of current electrode structures and on said active layer and making a Schottky contact therewith, means for relaxing electric field formed under the gate electrode on the drain side.

According to another aspect of the present invention, there is provided a semi-insulating compound semiconductor substrate; a compound semiconductor active layer formed on said substrate; a compound semiconductor high potential barrier layer formed on said compound semiconductor active layer on a drain side, said barrier layer having a wider energy band gap than said compound semiconductor active layer; a source electrode and a drain electrode formed interposing a channel region, said source and drain electrodes having ohmic contacts with said compound semiconductor active layer; and a gate electrode formed between said source and drain electrodes and having Schottky contacts with said compound semiconductor active layer on the source side and with said compound semiconductor high potential barrier layer on the drain side.

A Schottky gate electrode is formed partially on a potential barrier layer on the drain side. Accordingly, the electric field is relaxed near the edge portion of the Schottky gate electrode on the drain side. At the step portion of the potential barrier layer where the Schottky gate electrode directly contacts the channel layer on the drain side, the electric field is also relaxed because the gate electrode on the drain side functions as a field plate. Since the Schottky gate electrode on the source side directly contacts the channel layer, carriers can be easily injected from the channel layer into the Schottky gate electrode when a forward bias is applied to the Schottky gate electrode.

DETAILED DESCRIPTION OF THE PREFERRED EMBODIMENTS

Figure 1A:
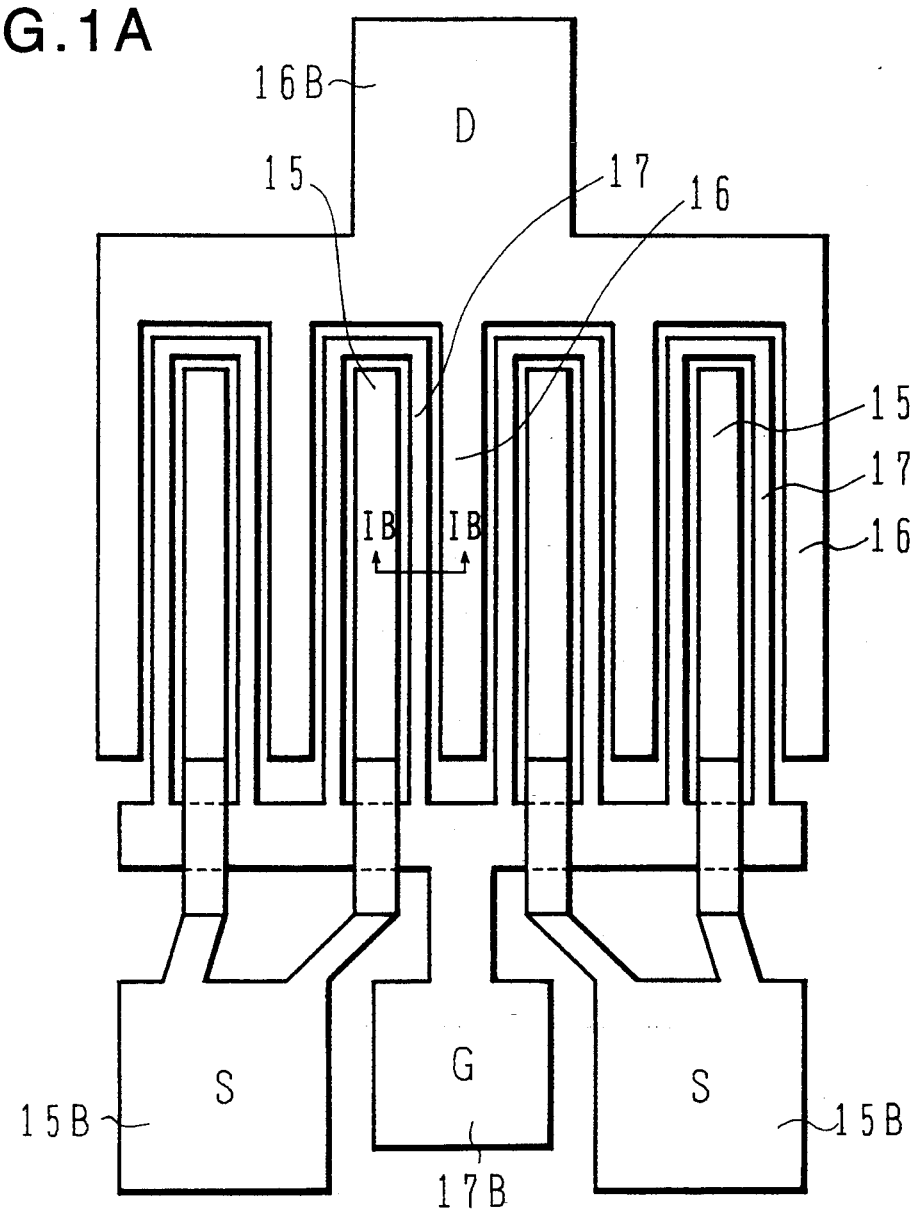
FIGS. 1A and 1B plan view and a cross sectional view of a field effect compound semiconductor device according to an embodiment of the present invention.
Figure 1B:
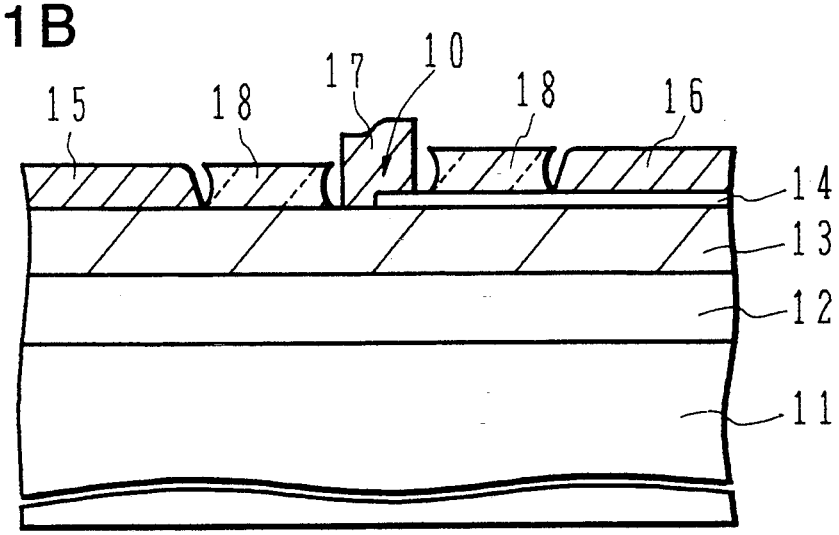

FIGS. 1A and 1B show an example of the structure of a MESFET according to an embodiment of the present invention. FIG. 1A is a schematic diagram showing an electrode pattern on the surface of a semiconductor substrate. A drain electrode 16 has a comb shape having five teeth. The five teeth are connected in common to an upper bonding pad 16B. Four source electrodes 15 are disposed at the areas between the five teeth of the drain electrode 16. Two source electrodes 15 are connected in common to a lower bonding pad 15B, and the other two source electrodes 15 are connected in common to another lower bonding pad 15B. A gate electrode 17 is disposed between the source electrodes 15 and drain electrode 16. The gate electrode 17 has a shape surrounding each source electrode 15 and is connected to a lower bonding pad 17B.

In this embodiment, the four source electrodes are illustratively used. The number and shape of source electrodes may be set as desired.

In an example, the width (length along the direction of current flow) of the source and drain electrodes 15 and 16 is about 10 $\mu$m, the gap between the source or drain electrode and the gate electrode 17 is 2–3 $\mu$m, and the width of the gate electrode is about 0.5 $\mu$m. The channel or gate length (length perpendicular to the direction of current flow) may be 50–300 $\mu$m per each, and the number of channels may be changed according to the desired power rating. An example of power rating is 500 mW at 20 GHz. The total channel length in this case may be 1 mm.

The cross sectional view as taken along line 1B—1B in FIG. 1A is shown in FIG. 1B. An i-type GaAs buffer layer 12 is epitaxially grown on a semi-insulating GaAs substrate 11. An active or channel layer 13 made of n-type GaAs is epitaxially grown on the i-type GaAs buffer layer 12, and a potential barrier layer 14 made of i-type GaAs is epitaxially grown on the active layer 13. The potential barrier layer 14 is formed only on a particular surface of the active layer 13. The end portion of the potential barrier layer 14 is indicated at 10. The gate electrode 17 made of Schottky metal is formed riding on the end portion 10 of the potential barrier layer 14. For example, one half area of the Schottky gate 17 contacts the active layer 13, and another half area contacts the potential barrier layer 14. It is preferable that the gate 17 overlaps the barrier layer 14 for a length of 100 nm or more in the source-drain direction.

Insulating films 18 made of $SiO_2$ are disposed on both sides of the Schottky gate 17. The source electrode 15 and drain electrode 16 making ohmic contacts with the substrate are formed at the outside of the insulating films 18 remotely from the Schottky gate 17.

The buffer layer 12 has a thickness of, e.g., 1000 nm and a crystalline quality suitable for further epitaxial growth on the surface thereof. The active layer 13 contains n-type impurities having a concentration of, e.g., 1 * $10^{17}$cm$^{-3}$ and has a thickness of about 200 nm. The potential barrier layer 14 is made of, e.g., i-type $Al_{0.2}Ga_{0.8}As$ and has a thickness of about 50 nm. The potential barrier layer 14 has a band gap wider than, and a resistance higher than, the active layer 13 made of GaAs. The Schottky gate electrode 17 is made of, e.g., Al. The source and gate electrodes 15 and 16 are made of a laminated layer of an AuGe film having a thickness of, e.g., 40 nm and an Au film having a thickness of, e.g., about 400 nm.

Figure 2A:
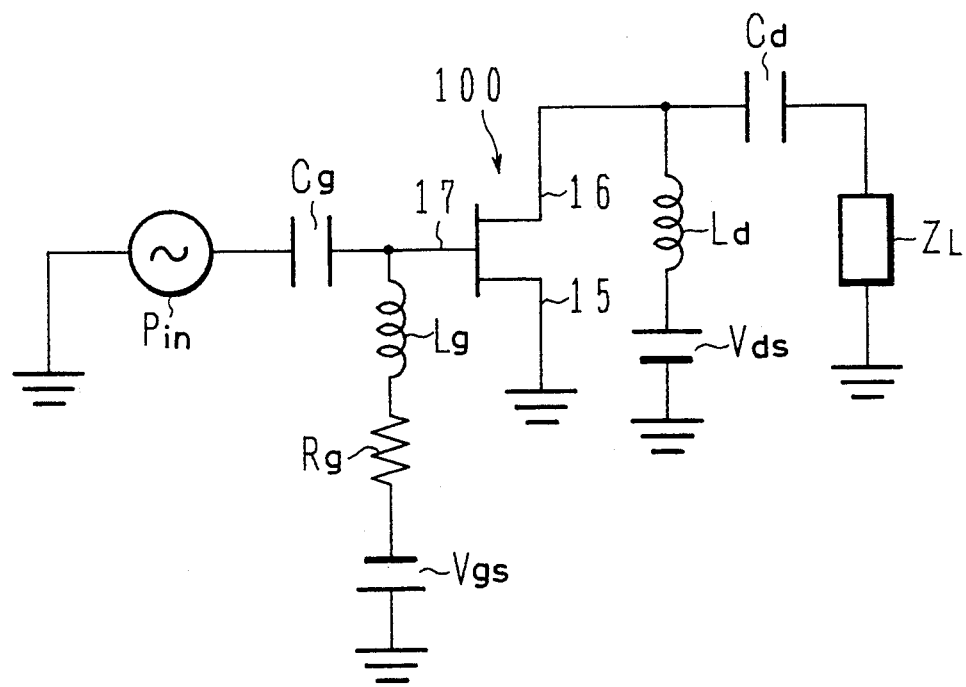
FIGS. 2A and 2B are a circuit diagram in which the field effect compound semiconductor device of the embodiment shown in FIGS. 1A and 1B is used, and a graph showing the characteristic curves of the devices.

The field effect compound semiconductor device shown in FIGS. 1A and 1B is used with a circuit such as shown in FIG. 2A. In FIG. 2A, a field effect semiconductor device has the structure shown in FIGS. 1A and 1B, and a source electrode 15 is grounded. The drain electrode 16 is connected via an inductor Ld to a drain bias voltage source Vds, and via a capacitor Cd to a load $Z_L$. The gate electrode 17 is connected via an inductor Lg and a resistor Rg to a gate bias voltage source Vgs, and via a capacitor Cg to an input voltage source $P_{in}$. The capacitors Cd and Cg are used for allowing only high frequency components to pass therethrough, and tile inductors Ld and Lg are used for supplying dc bias and intercepting high frequency components.

Figure 2B:
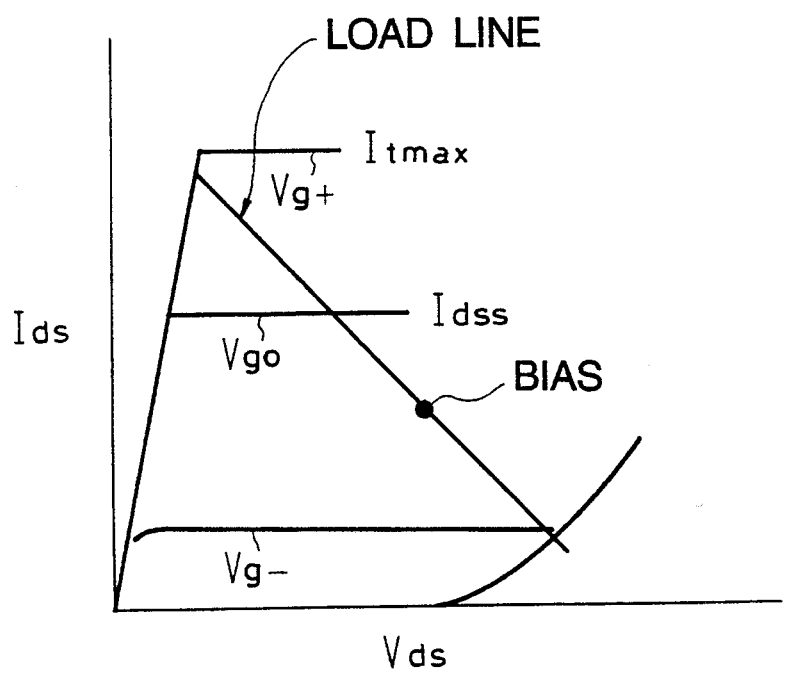

FIG. 2B is a graph showing the characteristics of the field effect compound semiconductor device 100, the abscissa representing a drain-source voltage Vds and the ordinate representing a drain-source current Ids. The graph shows characteristic curves of drain-source currents relative to a drain-source voltage, respectively at a large backward gate bias voltage Vg−, a ground potential gate bias voltage Vg0, and a maximum forward gate bias voltage Vg+. A load line for a resistive load is also shown in this graph.

When the gate voltage takes the maximum forward voltage, a forward bias voltage is applied to the Schottky gate electrode. When the gate voltage takes a large backward bias, the drain current reduces and the drain voltage increases and becomes near the drain bias voltage.

In order to further describe the characteristics of the semiconductor device shown in FIGS. 1A and 1B, the structure of a conventional semiconductor device will be described with reference to FIGS. 3A and 3B.

Figure 3A:
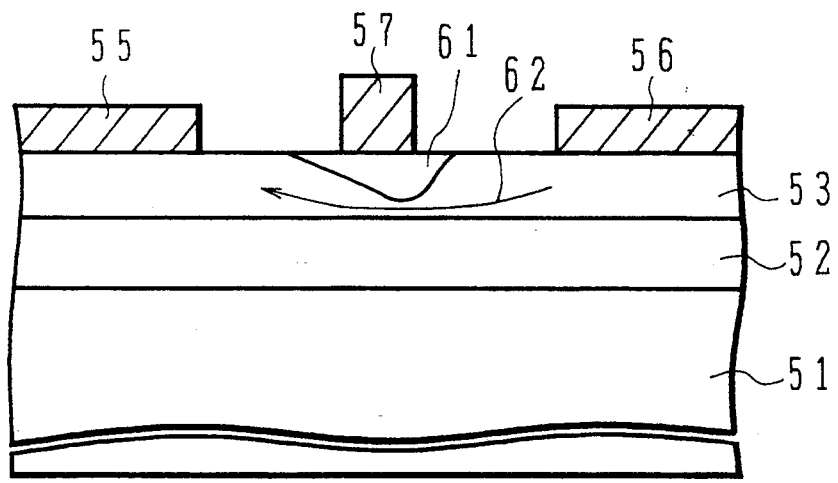
FIGS. 3A and 3B are cross sectional views showing examples of structure of conventional field effect compound semiconductor device.

FIG. 3A shows a typical structure of a conventional MESFET. In FIG. 3A, an i-type GaAs buffer layer 52 and an n-type GaAs active layer 53 are epitaxially grown on a semi-insulating GaAs substrate 51. A Schottky gate electrode 57 is formed on the surface of the active layer 53. Ohmic contact source and drain electrodes 55 and 56 are formed interposing the gate electrode 57. When a backward bias voltage is applied to the Schottky gate electrode 57, a depletion layer 61 develops under the gate electrode 57 to limit the passage of a current 62 flowing from the drain electrode 56 to the source electrode 55.

When a large backward bias voltage is applied to the Schottky gate electrode 57 of MESFET shown in FIG. 3A, the potential of the drain electrode 56 rises so that a high voltage is applied across the gate electrode 57 and drain electrode 56. Under these conditions, a high electric field is generated at the edge area of the Schottky gate 57 on the side of the drain electrode 56. If this high electric field exceeds the breakdown level of the Schottky electrode 57, a leakage current is generated. That is to say, electrons are injected from the Schottky gate electrode 57 into the active layer 53 toward the drain electrode 56.

It is desired to form the active layer 53 by using narrow band gap material so as to easily flow a desired current therethrough. However, if a Schottky gate electrode is formed directly on the active layer made of narrow band gap semiconductor material, the backward breakdown voltage of the Schottky gate electrode lowers.

Figure 3B:
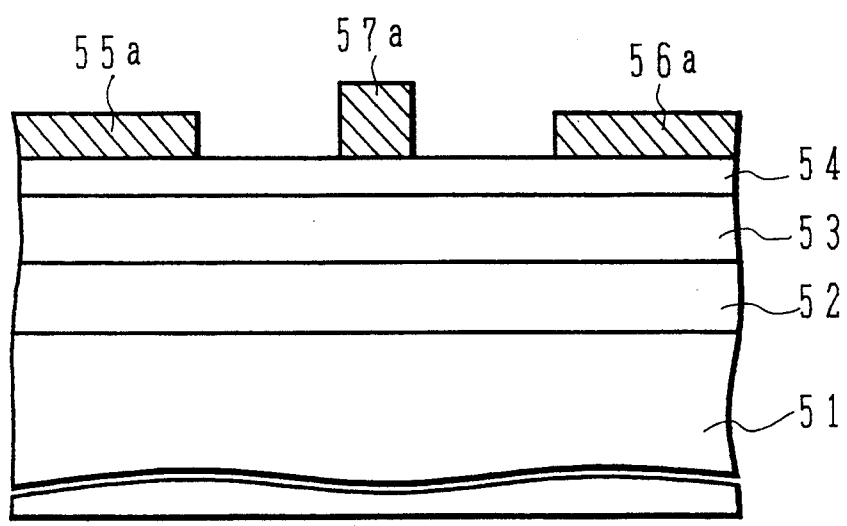

FIG. 3B shows the structure of a conventional field effect compound semiconductor device capable of improving the breakdown voltage of a Schottky gate electrode. Similar to the case shown in FIG. 3A, an i-type GaAs buffer layer 52 and an n-type GaAs active layer 53 are epitaxially grown on a semi-insulating GaAs substrate 51. A potential barrier layer 54 made of wide band gap AlGaAs is epitaxially grown on the active layer 53. Similar to the case shown in FIG. 3A, a Schottky gate electrode 57a, and ohmic contact source and drain electrodes 55a and 56a are formed on the potential barrier layer 54. The backward breakdown voltage of the gate electrode 57a can be improved because the underlie semiconductor layer is the wide band gap potential barrier layer 54. Therefore, even if a large backward bias voltage is applied to the gate electrode 57a, the gate current hardly flows.

Figure 4A:
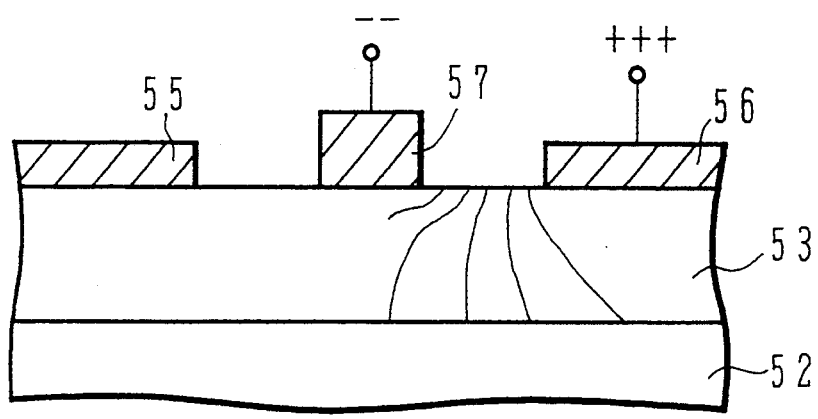
FIGS. 4A and 4G are schematic cross sectional views explaining the difference function between the embodiment device shown in FIGS. 1A and 1B and the conventional devices shown in FIGS. 3A and 3B.
Figure 4B:
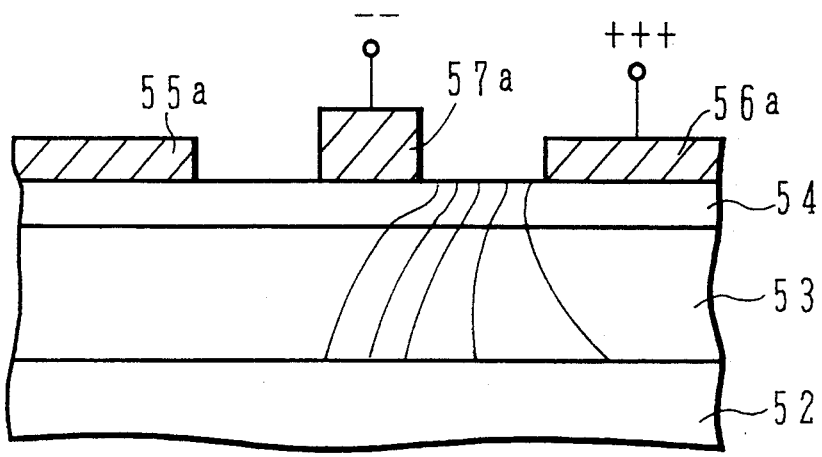
Figure 4C:
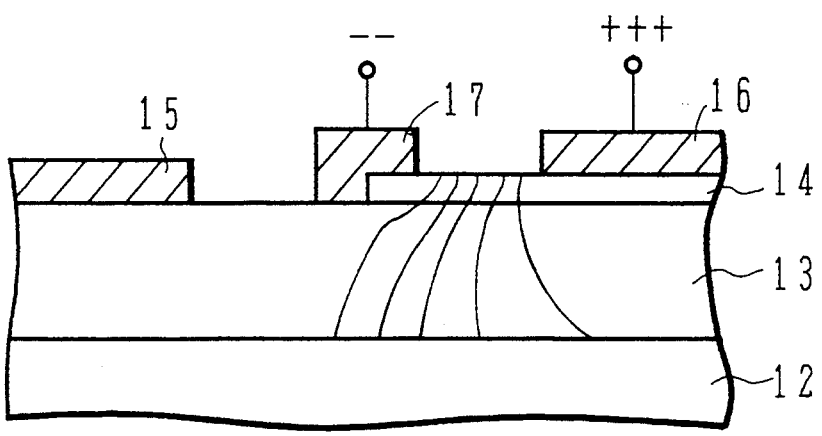

FIGS. 4A to 4C are schematic cross sectional views illustrating the electric field distribution (equipotential planes) in the semiconductor layers when a large backward bias voltage is applied to the gate electrode.

FIG. 4A is a cross sectional view showing the electric field distribution of the conventional semiconductor device shown in FIG. 3A, FIG. 4B shows the electric field distribution of the conventional semiconductor device shown in FIG. 3B, and FIG. 4C shows the electric field distribution of the embodiment semiconductor device shown in FIGS. 1A and 1B.

In the case of FIG. 4A in which a Schottky gate electrode 57 is formed directly on a GaAs active layer 53, if a large backward bias voltage is applied to the gate electrode 57, a high electric field is generated in a channel layer 53.

In the case of FIG. 4B, the electric field under a gate electrode 57a is relaxed by a potential barrier layer 54 having a wide band gap which is interposed between the gate electrode 57a and an active layer 53.

Figure 4D:
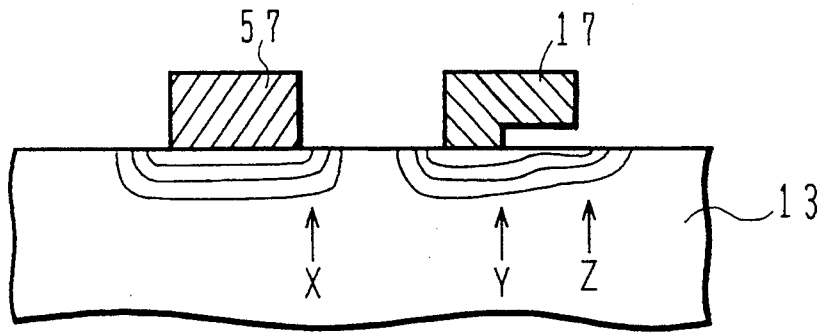

In the case of FIG. 4C, a potential barrier layer 14 is interposed between a gate electrode 17 and an active layer 13 on the drain side of the gate electrode 17. This potential barrier layer 14 relaxes the electric field under the gate electrode 17. Mechanism of relaxing an electric field is slightly different between the cases of FIGS. 4B and 4C. FIG. 4D is a schematic diagram explaining the function of the gate electrode shown in FIG. 4C. As illustrated at tile left side of FIG. 4D, if a Schottky electrode 57 is formed directly on an active layer 13, an electric field concentrates on an edge portion X. As illustrated at the right of FIG. 4D, if part of a Schottky electrode 17 contacting an active layer 13 is removed, two edge portions Y and Z are formed at the area where the gate electrode 17 directly contacts the active layer 13 and at the area under the actual side wall of the gate electrode 17. At the edge portion Y, the electric field is relaxed because of the effect like a field plate effect of the gate electrode 17 which extends to the right of the edge portion Y as viewed in FIG. 4D. At the edge portion Z, the electric field is relaxed because the actual gate electrode 17 is spaced apart from the active layer 13.

If the potential barrier layer is filled in the air gap under the gate electrode 17 shown in FIG. 4D, although a gentle electric field is generated in the potential barrier layer, the basics of relaxing the electric field distribution are similar.

Therefore, in the cases of FIGS. 4B and 4C, even if a high voltage is applied across the gate electrode and drain electrode, the electric field is relaxed so that a breakdown rarely occurs.

Figure 4E:
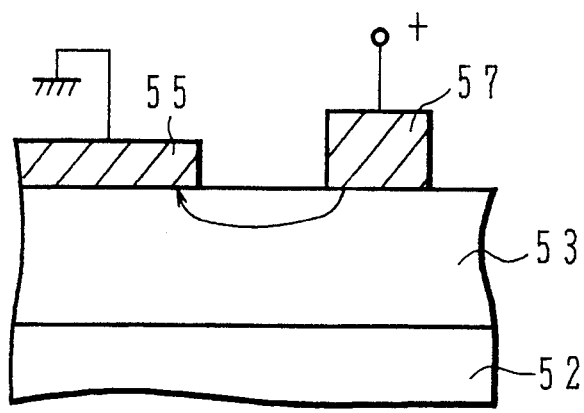
Figure 4F:
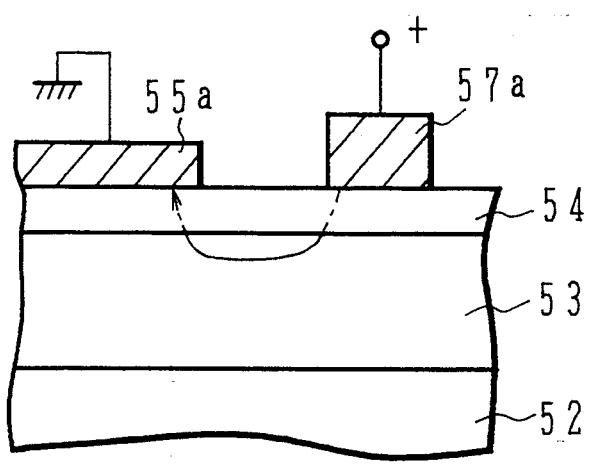
Figure 4G:
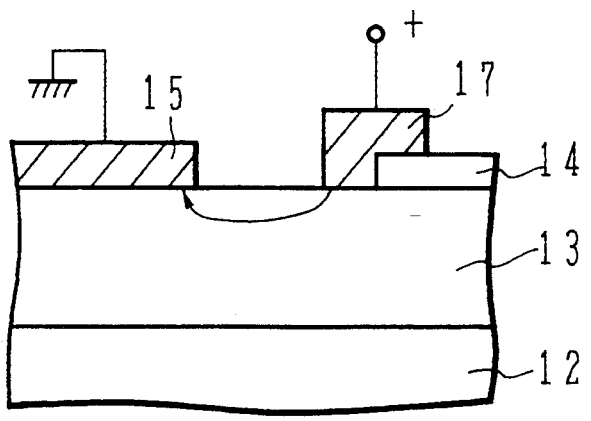

FIGS. 4E to 4G are cross sectional views explaining how a gate current flows when a forward bias voltage is applied to a gate electrode.

FIG. 4E is a cross sectional view corresponding to the conventional semiconductor device shown in FIG. 3A, FIG. 4F is a cross sectional view corresponding to the conventional semiconductor device shown in FIG. 3B, and FIG. 4G is a cross sectional view corresponding to the embodiment semiconductor device shown in FIGS. 1A and 1B. In the cases of FIGS. 4E and 4G, because a gate electrode 17 (57) directly contacts a GaAs active layer 13 (53), a current flows easily from the gate electrode 17 (57) to the active layer 13 (53) upon application of a forward bias voltage to the gate electrode. In the case of FIG. 4F, because a potential barrier layer 54 having a high resistance is interposed between a gate electrode 57a and source electrode 55a and an active layer 53, a gate current is not easy to flow upon application of a forward bias voltage to the gate electrode 57a.

A power addition efficiency $\eta_{add}$ which is an important parameter representing the performance of a high frequency semiconductor device, is given by:

$$\eta_{add} = (P_{out} - P_{in})/(V_{ds} * I_d) * 100 \, (\%)$$

Quantity $P_{out} - P_{in}$ is a difference between an output power and an input power, and represents a power amplified by a semiconductor device. Quantity $V_{ds}$, $I_d$ represents a power consumed by the semiconductor device. The power addition efficiency $\eta_{add}$ is therefore a parameter representing an amplified power relative to a consumed power. Assuming that $P_{out} - P_{in}$ and $V_{ds}$ are constant, the value of a power addition efficiency $\eta_{add}$ is determined by the value of a drain current $I_d$.

Figure 5A:
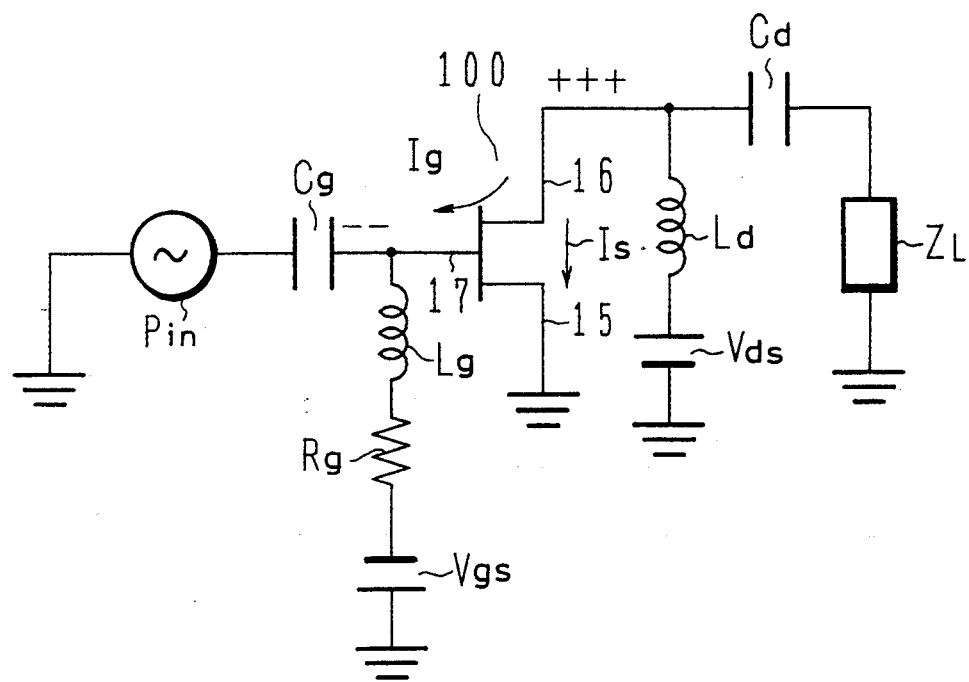
FIGS. 5A and 5B circuit diagrams explaining the flow of a gate current of a field effect compound semiconductor device in a large signal operation.

FIG. 5A is a circuit diagram using a field effect compound semiconductor device 100 in which a large backward bias voltage is applied to the gate electrode. When a large backward bias voltage is applied to the gate electrode 17 and the drain electrode 16 is maintained at a high voltage, a gate current Ig flows from the drain electrode 16 to the gate electrode 17. This gate current substantially raises the effective gate bias voltage and increases the drain current, assuming that the gate voltage externally applied to the gate electrode 17 is constant.

Figure 5B:
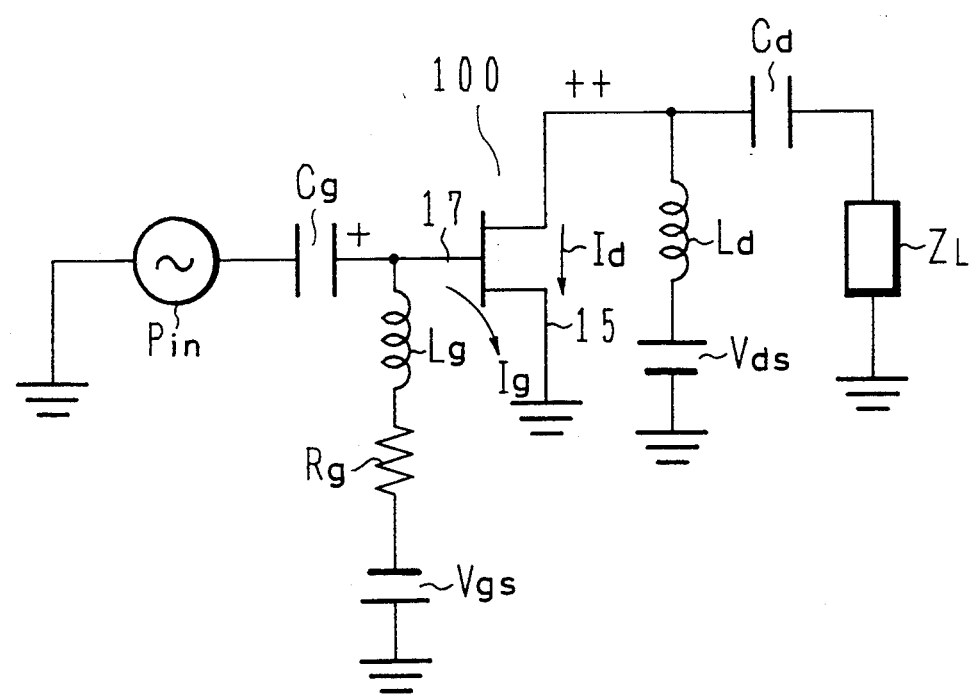

FIG. 5B is a circuit diagram explaining the operation in which a forward bias voltage is applied to the gate electrode 17. When the gate electrode 17 is forward biased relative to the source electrode 15, a gate current Ig flows from the gate electrode to the source electrode. This gate current substantially changes the gate voltage in the backward direction assuming that the gate bias voltage externally applied to the gate electrode 17 is constant. That is to say, this gate current Ig limits the drain current Id.

The power addition efficiency $\eta_{add}$ becomes larger as the drain current Id becomes smaller. Accordingly, the gate current Ig shown in FIG. 5A is not preferable because it increases the drain current Id, but the gate current Ig shown in FIG. 5B is preferable because it limits the drain current Id.

Figure 6:
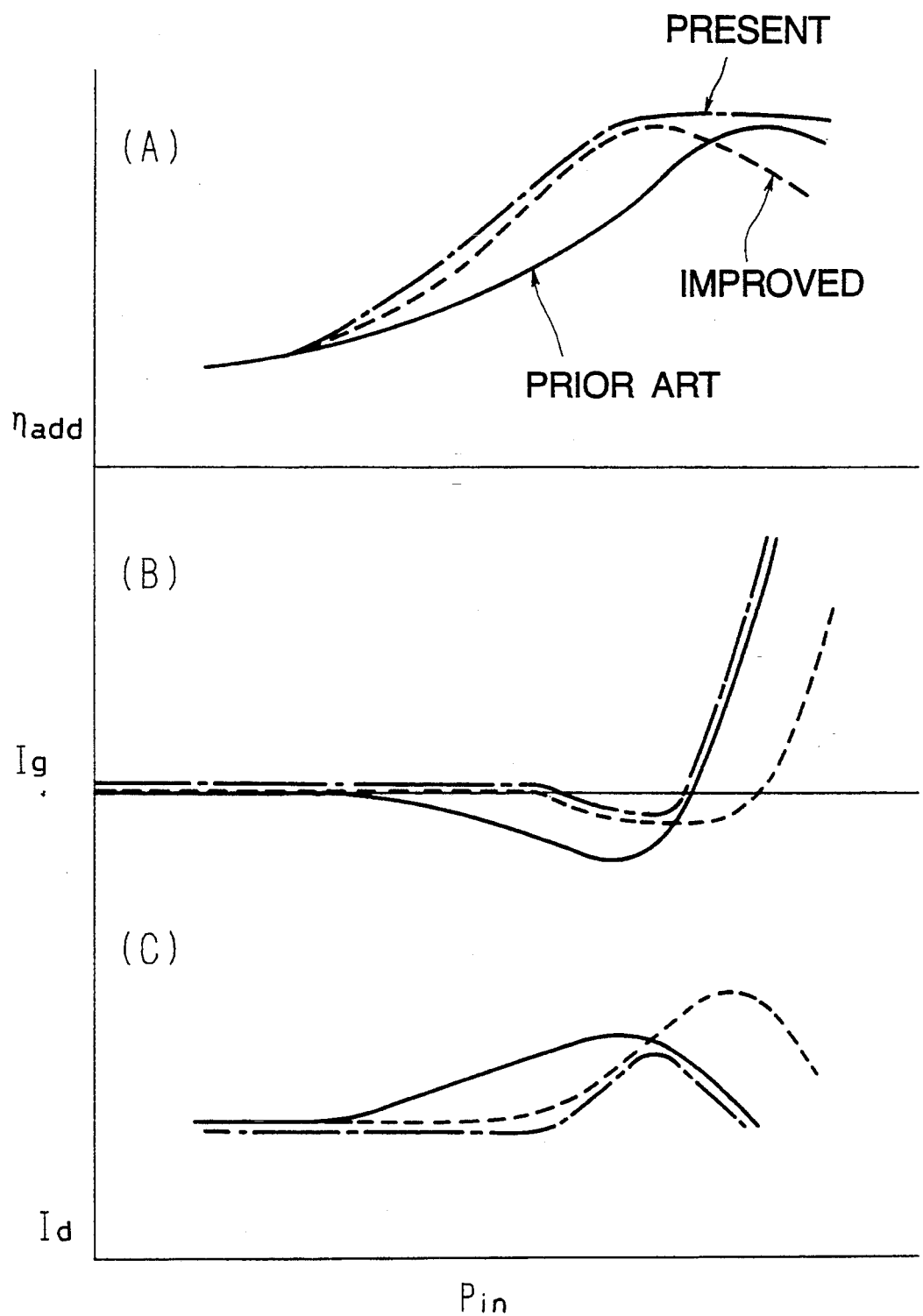
FIG. 6 graph comparing the characteristics of the embodiment device shown in FIGS. 1A and 1B and the convectional devices shown FIGS. 3A and 3B.

FIG. 6 is a graph showing the characteristics of the embodiment semiconductor device shown in FIGS. 1A and 1B, the conventional semiconductor device shown in FIG. 3A, and the conventional improved semiconductor device shown in FIG. 3B. In FIG. 6, the abscissa represents an input power $P_{in}$, the ordinate represents a power addition efficiency $\eta_{add}$, gate current Ig, and a drain current Id.

A negative voltage indicated by BIAS in FIG. 2B was applied to the gate electrodes. As the input signal power $P_{in}$ increases, the gate voltage swings up and down relative to the bias voltage BIAS. When the signal voltage becomes negative, the total gate voltage becomes more negative. In the case of the conventional semiconductor device shown in FIG. 3A, as an input signal power $P_{in}$ increases, a backward gate current Ig starts flowing because the backward breakdown voltage of its Schottky gate electrode is low. This backward gate current Ig increases the drain current Id. As the input signal power $P_{in}$ is further increased, the positive input signal voltage exceeds the backward bias voltage so that a forward bias is applied to the gate electrode. As a result, a forward current flows through the gate electrode, and the total gate current Ig changes from a negative value to a positive value. An increase of this forward gate current Ig reduces the drain current Id and increases the power addition efficiency $\eta_{add}$.

In the case of the conventional improved semiconductor device shown in FIG. 3B, a backward gate current is not easy to flow because the gate electrode has an improved backward breakdown voltage. As a result, even if the input power is increased, the backward gate current rarely flows. However, even if the gate voltage becomes a forward bias, the gate current Ig is not easy to flow and change from a negative value to a positive value because of the potential barrier layer. Accordingly, at the region having an increased input power $P_{in}$, the drain current Id increases and the power addition efficiency $\eta_{add}$ lowers.

In the case of the embodiment semiconductor device shown in FIGS. 1A and 1B, the gate electrode has a high backward breakdown voltage and it is easy to inject current from the gate electrode into the active layer. Accordingly, during the operation while the input power $P_{in}$ increases, the backward gate current Ig is not easy to flow and the forward gate current Ig is easy to flow. The drain current Id therefore rarely increases and the power addition efficiency $\eta_{add}$ is maintained high. In this manner, the characteristics of the embodiment semiconductor device incorporate substantially only the good characteristics of the conventional semiconductor device and conventional improved semiconductor device.

FIGS. 7A to 7E are lateral cross sectional views illustrating main processes of a method of manufacturing a MESFET according to an embodiment. The manufacturing method will be described in detail with reference to FIGS. 7A to 7E.

Figure 7A:
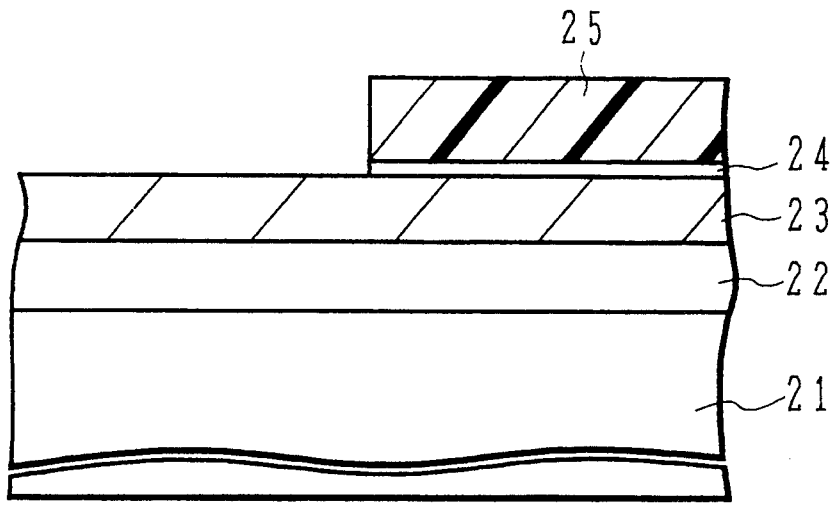
FIGS. 7A to 7E cross sectional views explaining a method of manufacturing the field effect compound semiconductor device shown FIGS. 1A and 1B.

As shown in FIG. 7A, a GaAs buffer layer 22, a GaAs active layer 23, and AlGaAs high potential barrier layer 24 are grown on a GaAs substrate 21 by molecular beam epitaxy (MBE). Instead of MBE, other crystal growth methods such as metal organic chemical vapor deposition (MOCVD) may be used. The substrate 21 is made of semi-insulating GaAs. The buffer layer 22 is made of i-type GaAs, and has a thickness of 1000 nm. The active layer 23 is made of n-type GaAs, and has an impurity concentration of $1 * 10^{17}$ cm$^{-3}$ and a thickness of 200 nm. The potential barrier layer 24 is made of i-type Al$_{1-x}$Ga$_x$As (x=0.2), and has a thickness of 50 nm. The thickness of the potential barrier layer 24 is preferably in a range of from 20 to 100 nm. If the thickness is less than 20 nm, a tunnelling current is likely to flow, and if the thickness is more than 100 nm, the field plate effect of a gate electrode having a step becomes weak.

By using a photolithography resist process, a resist film 25 is formed having an opening extending to the source side from generally the center of the area where a gate electrode is to be formed.

The high potential barrier layer 24 extending to the source side is wet etched by using buffered fluoric acid as an etchant.

Figure 7B:
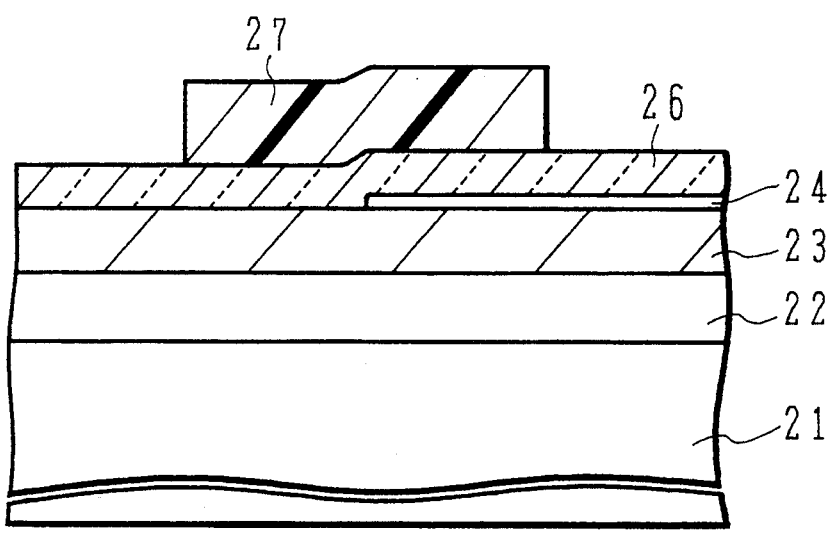

As shown in FIG. 7B, after the resist film 25 is removed, an insulating film 26 made of SiO$_2$ is deposited to a thickness of, for example, 300 nm by chemical vapor deposition (CVD).

By using a photolithography resist process, a resist film 27 is formed having openings at the areas where source and drain electrodes are formed.

Figure 7C:
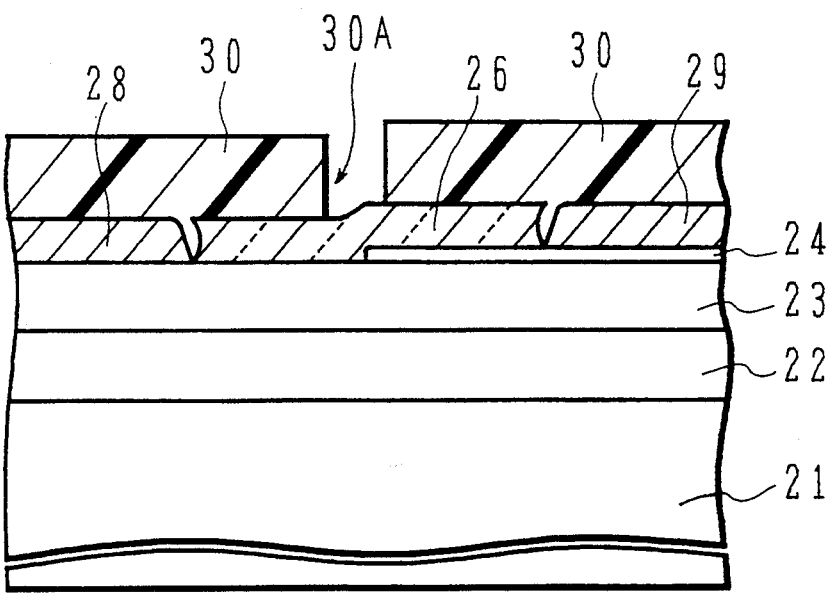

As shown in FIG. 7C, by using the resist film 27 as mask, the insulating film 26 made of SiO$_2$ is wet etched by using buffered fluoric acid as an etchant, to thus form source and drain electrode contact windows.

Without removing the resist film 27, an electrode material film made of AuGe/Au is vapor-deposited to a thickness of, for example, 40 nm/400 nm.

The resist film 27 is removed by immersing the substrate in resist removing liquid such as acetone. The electrode film on the resist is simultaneously lifted off. Thus, the electrode material film made of the AuGe/Au layer is patterned to form a source electrode 28 and a drain electrode 29.

By using a photolithography resist process, a resist Film 30 is formed having an opening at the area where a gate electrode is formed. In forming the opening, the edge of the high potential barrier layer 24 is aligned with generally the center of the gate in its width direction.

Figure 7D:
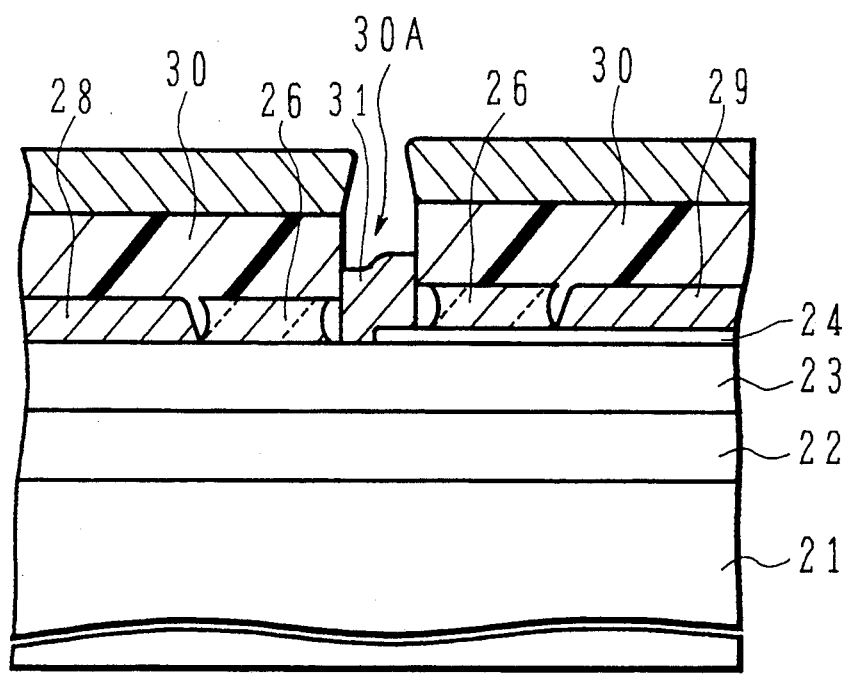

As shown in FIG. 7D, by using the resist film 30 as mask, the insulating film 26 made of SiO$_2$ is wet etched by using buffered fluoric acid as an etchant, to thus form a gate electrode contact window 30A.

Part of the high potential barrier layer 24 and part of the active layer 23 are exposed in the gate electrode contact window 30A.

An Al film is vapor-deposited to a thickness of, for example, 700 nm.

Figure 7E:
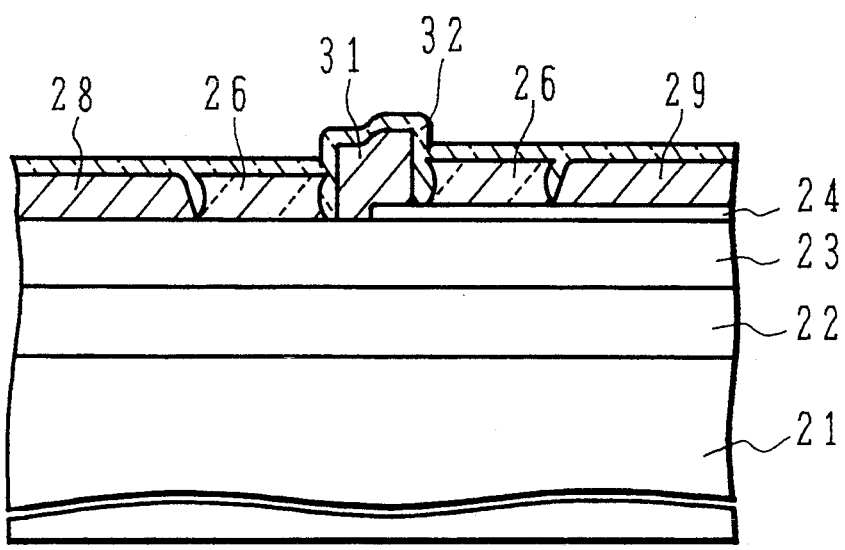

As shown in FIG. 7E, the resist film 30 is removed while lifting off the Al film deposited thereon by immersing the substrate in resist removing liquid such as acetone. Thus, the Al film is patterned to form a gate electrode 31.

The gate electrode 31 contacts the high potential barrier layer 24 on the drain side, and contacts the active layer 23 on the source side.

An SiN film 32 is formed by plasma chemical vapor deposition (plasma CVD) to complete a MESFET.

The MESFET manufactured by the above processes has an improved power addition efficiency $\eta_{add}$ because a current is not easy to flow through the drain-gate path but easy to flow through the gate-source path, as described in connection with FIGS. 4A to 4G.

Although description has been made on the case where a drain electrode is formed on a potential barrier layer, the drain electrode may also be formed directly on the active layer. Further, the configuration of gate electrode is not limited to that described hereinabove.

FIGS. 8A to 8D show other configurations of MESFET's according to other embodiments of this invention. If FIG. 8A, a drain electrode 16a is formed on and makes ohmic contact with an active layer 13. A gate electrode 17 is disposed partly on the active layer 13 and partly on a potential barrier layer 14, and makes Schottky contacts therewith. The potential barrier layer 14 is inserted between the gate electrode 17 and the active layer 13 on the drain side, but does not extend to the drain electrode 16a. Other points are similar to the embodiment described above.

Figure 8A:
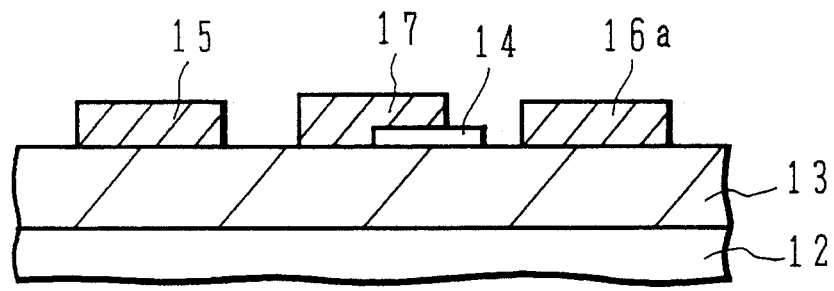
FIGS. 8A to 8D cross sectional views showing other configurations of MESFET's according to other embodiments of the invention.
Figure 8B:
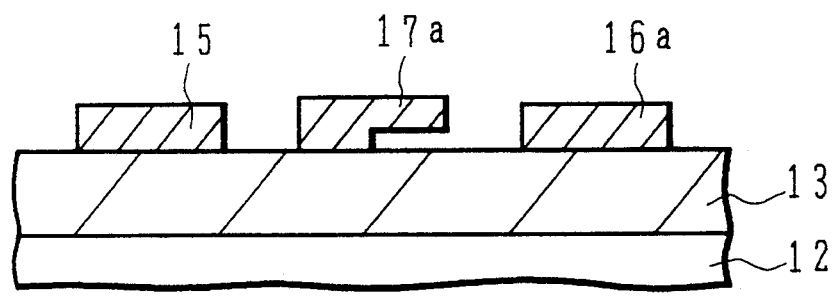

In FIG. 8B, a gate electrode 17a is disposed on the active layer 13 and has an extension toward the drain electrode 16a above the active layer. The extension is separated from the active layer by an air gap. The extension of the gate electrode 17a relaxes the field concentration which is otherwise established at the edge of the contact surface of the gate electrode 17a on the drain side. Other points are similar to the configuration of FIG. 4A. The air gap may be replaced with some insulating region.

Figure 8C:
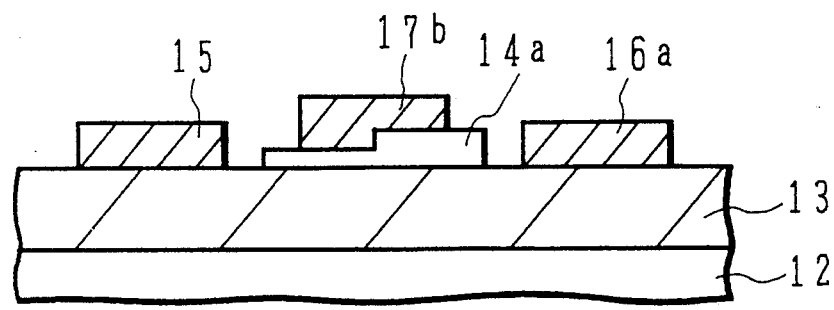

In FIG. 8C, a gate electrode 17b is disposed on a potential barrier layer 14a which is, in turn, formed on the active layer 13 and has a step. The potential barrier layer 14a has a larger thickness on the drain side and a smaller thickness on the source side. Thus, the distance between the gate electrode 17b and the active layer 13 is larger on the drain side. Therefore, electric field distribution under the gate electrode 17b is relatively relaxed on the drain side.

Figure 8D:
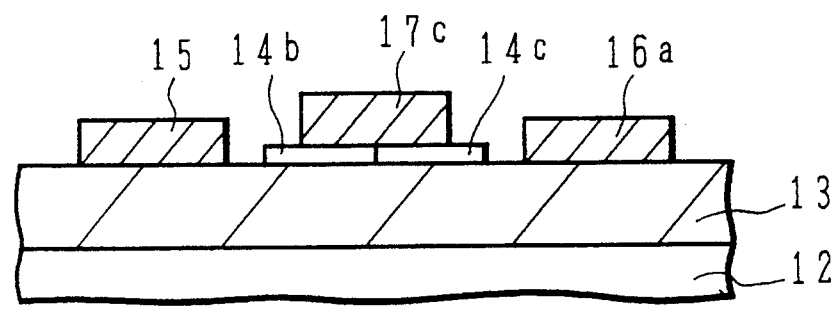

In FIG. 8D, a gate electrode 17c is disposed on potential barrier layers 14b and 14c, which are, in turn, formed on the active layer 13. The potential barrier layers 14b and 14c have tile same thickness, but have different field relaxation effect. The field distribution in the potential barrier 14c is more relaxed than in the potential barrier layer 14b. Other points are similar to those in FIG. 8A.

In tile configurations shown in FIGS. 8A to 8D, the electric field distribution at the corner of the gate electrode on the drain side is relaxed, similar to the embodiments shown in FIGS. 1A and 1B by the gate electrode structure and/or the potential barrier layer under the gate electrode.

The present invention has been described in connection with the preferred embodiments. The invention is not limited only to the above embodiments. For example, it is sufficient if the potential barrier layer has a wider band gap than the channel layer. The materials of substrate/channel /potential barrier may be GaAs (InP-)/InGaAs/AlGaAs or InP InP/InGaP. The material for ohmic contacts and Schottky electrode is not limited. It is apparent for those skilled in the art that various modifications, improvements, combinations and the like can be made within the scope and spirit of the present invention.

I claim:

1. A field effect semiconductor device comprising:
a compound semiconductor active layer;
first and second current electrode structures formed on and respectively making Ohmic contacts with said active layer;
a gate electrode disposed between said first and second current electrode structures and on said active layer to define a first side of said gate electrode which is closer to said first current electrode structure than said second current electrode structure and a second side of said gate electrode which is closer to said second current electrode structure than said first current electrode structure, said gate electrode making a Schottky contact with said active layer; and
relaxing means, disposed between said gate electrode and said active layer and under the first side of said gate electrode, the first side of said gate electrode contacting said active layer through said relaxing means and the second side of said gate electrode directly contacting said active layer to form an asymmetrical configuration of said relaxing means with respect to the first and second sides of said gate electrode, for relaxing an electric field formed under the first side of said gate electrode as compared to the semiconductor device configured without comprising said relaxing means and the first side of said gate electrode directly contacting said active layer, and for allowing easier injection of carriers between said second current electrode structure and said gate electrode as compared to the injection of carriers between said first current electrode structure and said gate electrode.

2. A field effect semiconductor device according to claim 1, wherein said relaxing means comprises a potential barrier layer formed of a semiconductor having a wider energy band gap than said active layer and disposed between the first side of the gate electrode and said active layer, the second side of said gate electrode directly contacting said active layer.

3. A field effect semiconductor device according to claim 1, wherein said relaxing means comprises a gap formed between the first side of said gate electrode and said active layer, the second side of said gate electrode directly contacting said active layer.

4. A field effect semiconductor device according to claim 1, wherein said relaxing means comprises a potential barrier layer formed of a semiconductor having a wider energy band gap than said active layer and disposed between said gate electrode and said active layer, the barrier layer having a larger thickness under the first side of said gate electrode than under the second side of the gate electrode.

5. A field effect semiconductor device according to claim 1, wherein said relaxing means comprises a potential barrier layer formed of a semiconductor having a wider energy band gap than said active layer and disposed between said gate electrode and said active layer, the potential barrier layer being under the first side of said gate electrode to form an asymmetrical configuration of the potential barrier layer with respect to the first and second sides of the gate electrode, the potential barrier layer having a different relaxation effect on the first side of said gate electrode than on the second side of said gate electrode.

6. A field effect transistor according to claim 2, wherein said potential barrier layer extends from said gate electrode to said first current electrode structure and is disposed between said first current electrode structure and said active layer.

7. A field effect semiconductor device comprising:
a semi-insulating compound semiconductor substrate;
a compound semiconductor active layer formed on said semi-insulating compound semiconductor substrate;
a source electrode formed on, and having ohmic contact with, said compound semiconductor active layer and defining a source side of said semiconductor device;
a drain electrode formed on, and having ohmic contact with, said compound semiconductor active layer and defining a drain side of said semiconductor device, a channel region being between said source electrode and said drain electrode;

a compound semiconductor high potential barrier layer formed on said compound semiconductor active layer and solely on the drain side of said semiconductor device, said compound semiconductor high potential barrier layer having a wider energy band gap than said compound semiconductor active layer; and a gate electrode formed between said source electrode and said drain electrode and having respective Schottky contacts with said compound semiconductor active layer on the source side of said semiconductor device and with said compound semiconductor high potential barrier layer on the drain side of said semiconductor device.

8. A field effect semiconductor device according to claim 7, wherein said compound semiconductor high potential barrier layer is made of AlGaAs.

9. A field effect semiconductor device according to claim 7, wherein said compound semiconductor active layer is made of GaAs or InGaAs.

10. A field effect semiconductor device according to claim 9, wherein said compound semiconductor high potential barrier layer is made of AlGaAs.

11. A field effect semiconductor device according to claim 7, wherein said gate electrode is made of Al.

12. A field effect semiconductor device according to claim 7, wherein said drain electrode has a comb shape with teeth, and said source electrode is disposed between the teeth of the comb shape.

13. A field effect semiconductor device according to claim 12, wherein said gate electrode surrounds said source electrode between the teeth of the comb shape.

14. A field effect semiconductor device according to claim 7, wherein said compound semiconductor high potential barrier layer has a thickness of 20-100 nm.

15. A field effect semiconductor device according to claim 7, wherein said gate electrode overlaps said compound semiconductor high potential barrier layer at least by 100 nm.

16. A field effect semiconductor device according to claim 10, wherein said gate electrode is made of Al.

17. A field effect semiconductor device according to claim 10, wherein said compound semiconductor high potential barrier layer has a thickness of 20-100 nm.

18. A field effect semiconductor device according to claim 10, wherein said gate electrode overlaps said compound semiconductor high potential barrier layer by at least 100 nm.

19. A field effect semiconductor device comprising:
a compound semiconductor active layer;

first and second current electrode structures formed on and respectively making Ohmic contacts with said active layer;

a gate electrode disposed between said first and second current electrode structures and on said active layer to define a first side of said gate electrode which is closer to said first current electrode structure than said second current electrode structure and a second side of said gate electrode which is closer to said second current electrode structure than said first current electrode structure, said gate electrode making a Schottky contact with said active layer; and relaxing means for relaxing an electric field formed under the first side of said gate electrode, said relaxing means comprising a potential barrier layer formed of a semiconductor having a wider energy band gap than said active layer and disposed between said gate electrode and said active layer, the barrier layer having a larger thickness under the first side of said gate electrode than under the second side of the gate electrode.

20. A field effect semiconductor device comprising:
a semi-insulating compound semiconductor substrate;
a compound semiconductor active layer formed on said semi-insulating compound semiconductor substrate;

a source electrode formed on, and having ohmic contact with, said compound semiconductor active layer and defining a source side of said semiconductor device;

a drain electrode formed on, and having ohmic contact with, said compound semiconductor active layer and defining a drain side of said semiconductor device, a channel region being between said source electrode and said drain electrode;

a compound semiconductor high potential barrier layer formed on said compound semiconductor active layer on the drain side of said semiconductor device, said compound semiconductor high potential barrier layer having a wider energy band gap than said compound semiconductor active layer; and a gate electrode formed between said source electrode and said drain electrode and having respective Schottky contacts with said compound semiconductor active layer on the source side of said semiconductor device and with said compound semiconductor high potential barrier layer on the drain side of said semiconductor device, said gate electrode overlapping said compound semiconductor high potential barrier layer at least by 100 nm.

* * * * *

UNITED STATES PATENT AND TRADEMARK OFFICE
CERTIFICATE OF CORRECTION

PATENT NO. : 5,399,886
DATED : March 21, 1995
INVENTOR(S) : Yuuichi HASEGAWA

It is certified that error appears in the above-indentified patent and that said Letters Patent is hereby corrected as shown below:

Col. 6, line 31, delete "Vds,Id" and insert therefor --Vds*Id--.

Col. 7, line 29, delete "Voltage" and insert therefor --voltage--.
Line 66, delete "Al$_{1x}$Ga$_x$As(x=0.2)" and insert therefor
--AlxGa$_1$-xAs(x=0.2)--.

Col. 9, line 49, insert a slash ("/") between "InP" and "InP".

Signed and Sealed this

Thirtieth Day of May, 1995

Attest:

BRUCE LEHMAN

*Attesting Officer*          *Commissioner of Patents and Trademarks*